United States Patent
Hofmeister et al.

(10) Patent No.: US 10,269,604 B2
(45) Date of Patent: Apr. 23, 2019

(54) SUBSTRATE TRANSPORT VACUUM PLATFORM

(71) Applicant: Persimmon Technologies, Corp., Wakefield, MA (US)

(72) Inventors: Christopher Hofmeister, Hampstead, NH (US); Martin Hosek, Lowell, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 816 days.

(21) Appl. No.: 14/601,455

(22) Filed: Jan. 21, 2015

(65) Prior Publication Data
US 2015/0214086 A1 Jul. 30, 2015

Related U.S. Application Data

(60) Provisional application No. 61/929,536, filed on Jan. 21, 2014.

(51) Int. Cl.
*H02K 7/09* (2006.01)
*H01L 21/677* (2006.01)
(Continued)

(52) U.S. Cl.
CPC .... *H01L 21/67709* (2013.01); *F16C 32/0434* (2013.01); *F16C 32/0465* (2013.01);
(Continued)

(58) Field of Classification Search
CPC ............. F16C 32/0434; F16C 32/0472; F16C 32/044; H01L 21/67709; H02K 7/09;
(Continued)

(56) References Cited

U.S. PATENT DOCUMENTS

| | | | | |
|---|---|---|---|---|
| 6,983,701 B2* | 1/2006 | Thornton | ................ | B60L 13/06 104/282 |
| 7,448,327 B2* | 11/2008 | Thornton | ................ | B60L 13/06 104/282 |

(Continued)

FOREIGN PATENT DOCUMENTS

| CN | 1895971 A | 1/2007 |
|---|---|---|
| WO | WO 93/09570 A1 | 5/1993 |

OTHER PUBLICATIONS

Hosed, M. et al.; "Robot Having Independent Arms"; U.S. Appl. No. 61/825,162, filed May 20, 2013.

*Primary Examiner* — John K Kim
(74) *Attorney, Agent, or Firm* — Harrington & Smith

(57) ABSTRACT

An apparatus including a first device configured to support at least one substrate thereon; and a first transport having the device connected thereto. The transport is configured to carry the device. The transport includes a plurality of supports which are movable relative to one another along a linear path; at least one magnetic bearing which at least partially couples the supports to one another. A first one of the magnetic bearings includes a first permanent magnet and a second magnet. The first permanent magnet is connected to a first one of the supports. A magnetic field adjuster is connected to the first support which is configured to move the first permanent magnet and/or vary influence of a magnetic field of the first permanent magnet relative to the second magnet.

22 Claims, 12 Drawing Sheets

(51) Int. Cl.
*F16C 32/04* (2006.01)
*H02J 50/12* (2016.01)
*H02J 50/90* (2016.01)
*H02J 50/10* (2016.01)
*H02J 50/05* (2016.01)

(52) U.S. Cl.
CPC .... *F16C 32/0472* (2013.01); *H01L 21/67742* (2013.01); *H02J 50/10* (2016.02); *H02J 50/12* (2016.02); *H02J 50/90* (2016.02); *H02J 50/05* (2016.02)

(58) Field of Classification Search
CPC .......... H02K 9/02; H02K 33/00; H02K 33/12; H02K 33/18; H02K 41/0356
USPC ........................ 310/12.02, 12.05, 12.11, 90.5
IPC ........................................................ H02K 7/09
See application file for complete search history.

(56) References Cited

U.S. PATENT DOCUMENTS

| | | | |
|---|---|---|---|
| 2004/0119358 A1* | 6/2004 | Thornton | B60L 13/06 310/180 |
| 2006/0130699 A1* | 6/2006 | Thornton | B60L 13/06 104/284 |
| 2009/0179720 A1 | 7/2009 | Ni et al. | 335/302 |
| 2012/0181980 A1 | 7/2012 | Ichikawa et al. | 320/108 |
| 2013/0057263 A1 | 3/2013 | Hosek et al. | |
| 2013/0069450 A1 | 3/2013 | Hosek et al. | |
| 2013/0071218 A1 | 3/2013 | Hosek et al. | |
| 2013/0085002 A1 | 4/2013 | Hosek | 464/29 |
| 2013/0085003 A1 | 4/2013 | Hosek | 464/29 |
| 2014/0205416 A1 | 7/2014 | Hosek et al. | |
| 2014/0365004 A1 | 12/2014 | Hosek et al. | |
| 2015/0075961 A1* | 3/2015 | Fukada | C10B 57/04 201/19 |
| 2015/0214086 A1* | 7/2015 | Hofmeister | H01L 21/67709 414/744.5 |

* cited by examiner

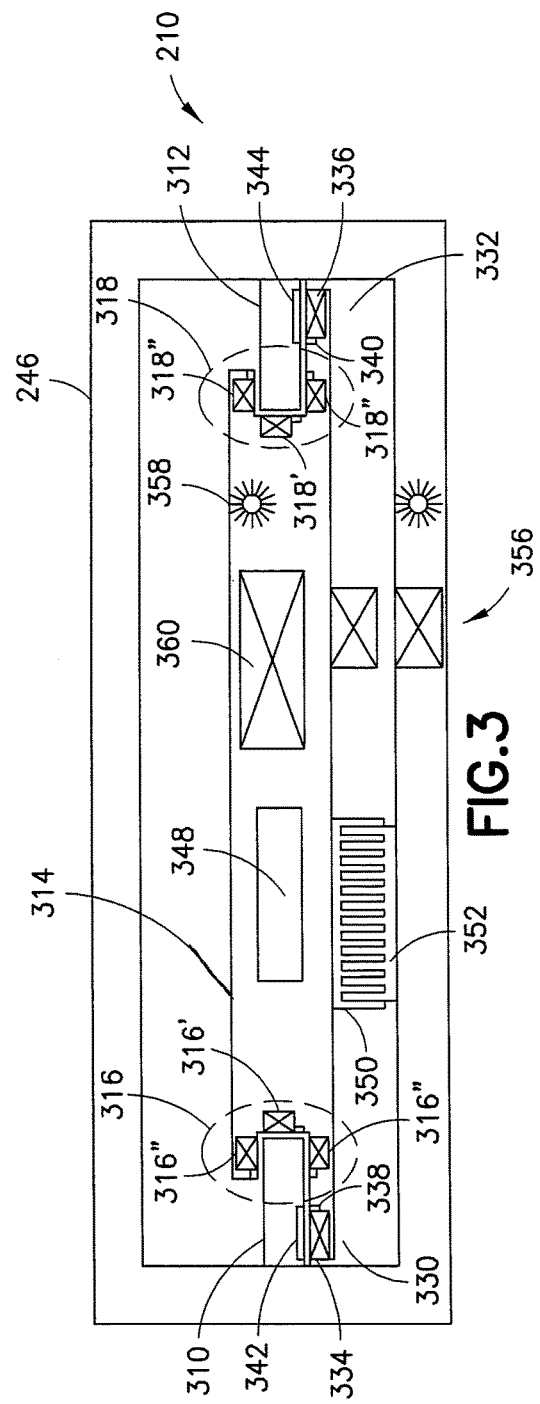
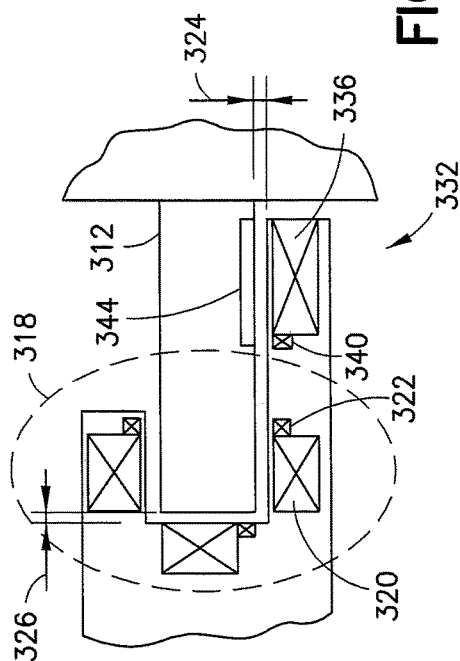

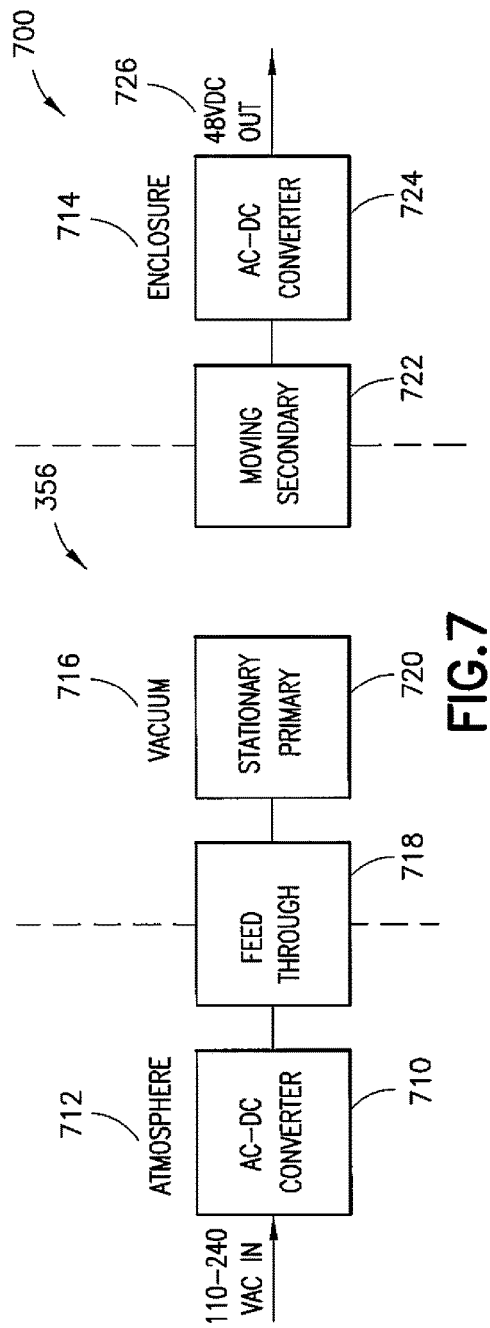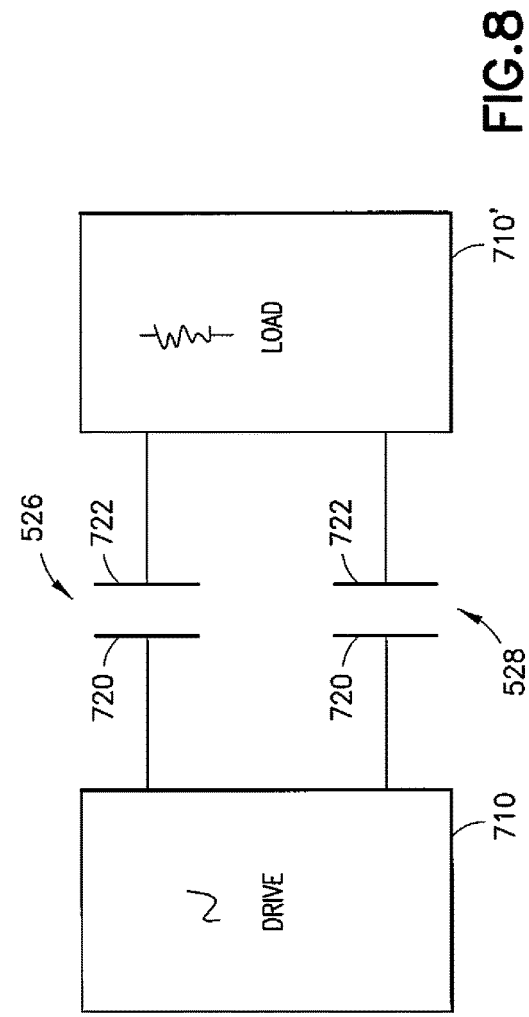

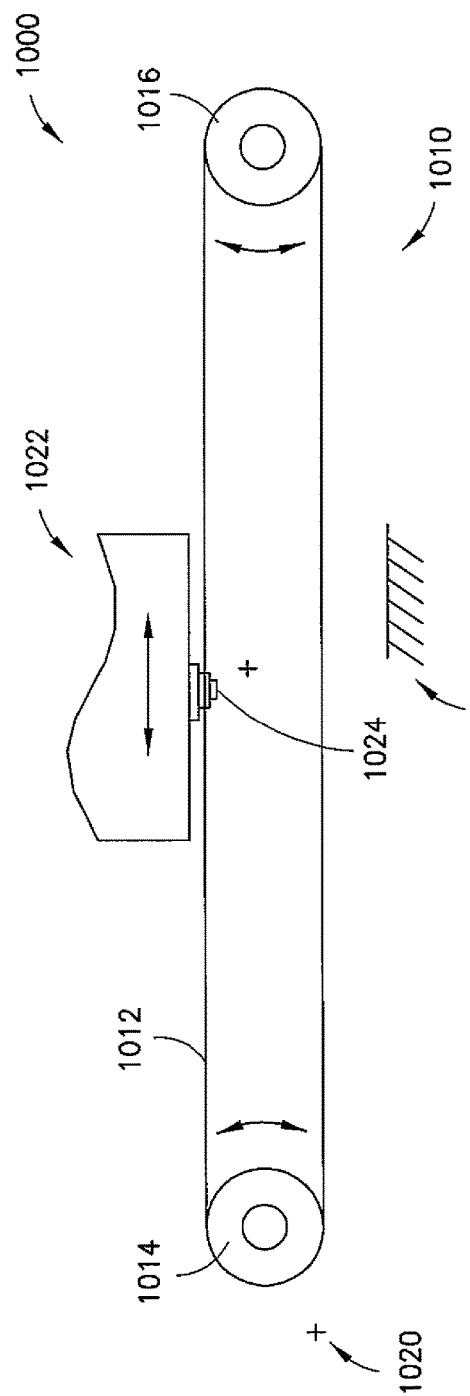
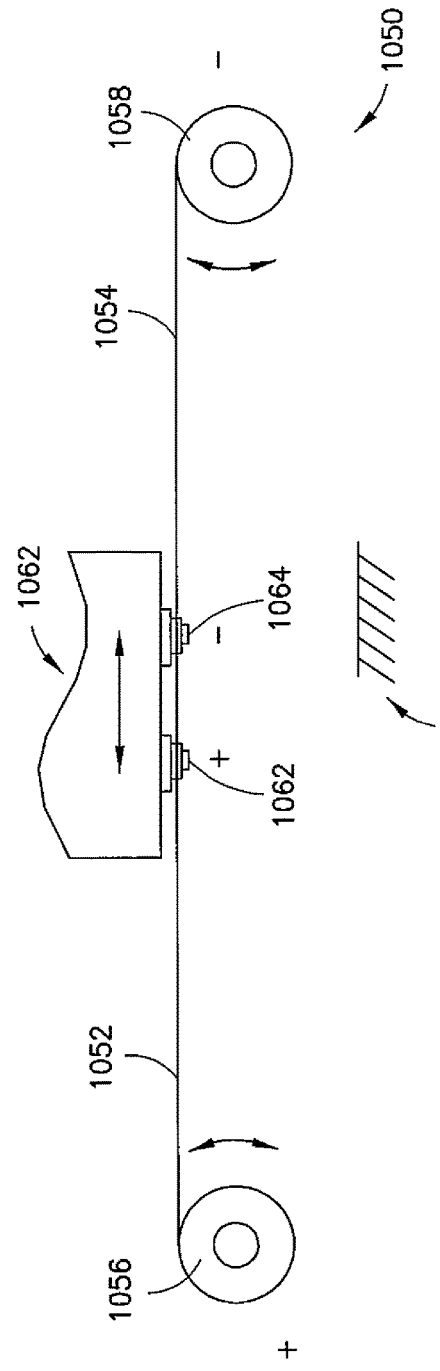
FIG.13
FIG.14

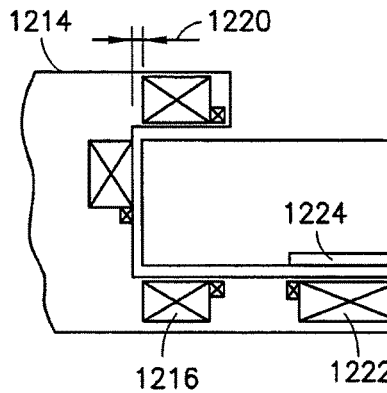
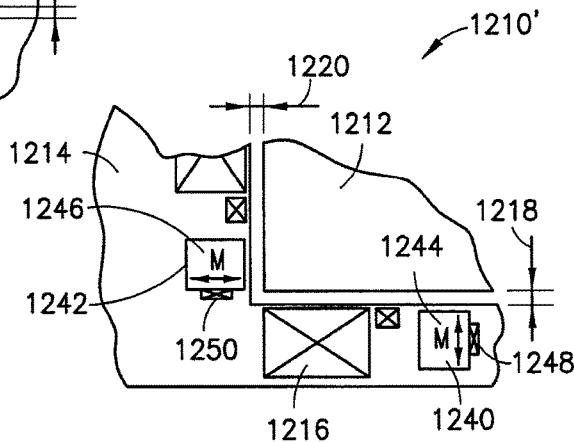
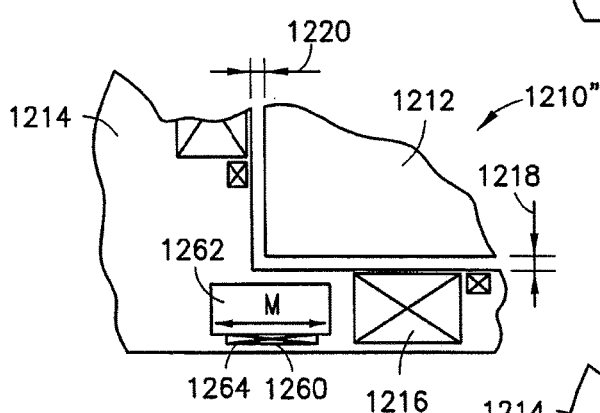
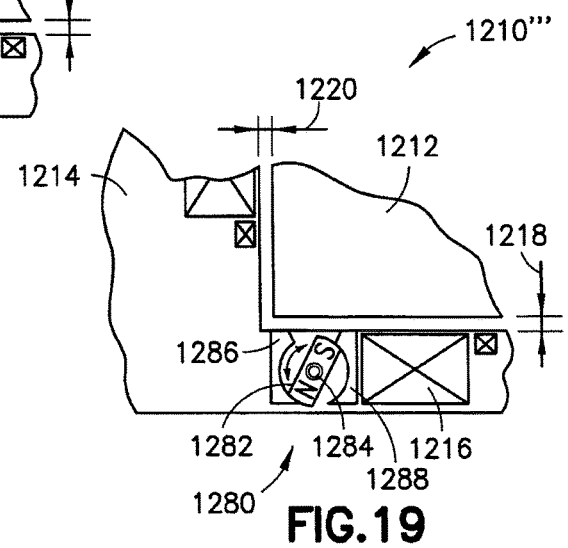
FIG.16
FIG.17
FIG.18
FIG.19

SUBSTRATE TRANSPORT VACUUM PLATFORM

CROSS REFERENCE TO RELATED APPLICATIONS

This application claims priority under 35 USC 119(e) on Provisional Patent Application No. 61/929,536 filed Jan. 21, 2014 which is hereby incorporated by reference in its entirety.

BACKGROUND

Technical Field

The exemplary and non-limiting embodiments relate generally to a system for transporting substrates and, more particularly, to a system for transporting substrates, in vacuum, having a linear configuration.

Brief Description of Prior Developments

Substrate processing systems for semiconductor, LED or other suitable applications may involve the transport of substrates in a vacuum or other suitable environment. In the applications requiring vacuum transport there are platform architectures that involve the use of single or alternately the use of tandem or quad process modules. Single process modules may have a single processing location, whereas tandem or quad process modules may have two processing locations where two substrates may be processed next to each other and picked or placed by a vacuum robot at the same time. The process modules are typically arranged in a radial arrangement on a vacuum chamber having a robot that transfers substrates between the process modules and load locks. A problem arises in the use of process modules where a large number of modules are provided. A large radial transport chamber is required to transport the substrates to and from load locks, and to and from the one or more modules, requiring a large footprint or floor space. With footprint cost at a premium within a micro-electronics fabrication environment, there is a desire for a substrate transport platform with a reduced footprint.

SUMMARY

In accordance with one aspect of the exemplary embodiment, an apparatus is provided comprising a first device configured to support at least one substrate thereon; and a first transport having the device connected thereto, where the transport is configured to carry the device, where the transport comprises: a plurality of supports which are movable relative to one another along a linear path; at least one magnetic bearing which at least partially couples the supports to one another, where a first one of the magnetic bearings comprises a first permanent magnet and a second magnet, where the first permanent magnet is connected to a first one of the supports; and a magnetic field adjuster connected to the first support which is configured to move the first permanent magnet and/or vary influence of a magnetic field of the first permanent magnet relative to the second magnet.

In accordance with another aspect of the exemplary embodiment, an apparatus is provided comprising a device configured to support at least one substrate thereon; and a transport having the device connected thereto, where the transport is configured to carry the device, where the transport comprises: a first support comprising a first capacitive interface; and a second support comprising a second capacitive interface, where the second support is movably connected to the first support along a linear path, and where the first and second capacitive interfaces are sized, shaped and located relative to each other to provide a non-contacting capacitive power coupling and to allow heat transfer between the first and second capacitive interfaces.

In accordance with another aspect of the exemplary embodiment, an apparatus is provided comprising a device configured to support at least one substrate thereon; and a transport having the device connected thereto, where the transport is configured to carry the device, where the transport comprises: a plurality of supports which are movable relative to one another along a linear path, where a first one of the supports comprises a heat radiator thereon; a first magnetic bearing which at least partially couples the supports, where the first magnetic bearing is a non-contacting bearing; a first power coupling between the supports, where the first power coupling is a non-contacting power coupling; and a first heat pump connected to the first support, where at least one of the first magnetic bearing and the first power coupling comprise at least one active heat generating component, and where the first heat pump is configured to pump heat from the at least one active heat generating component to the heat radiator.

In accordance with another aspect an example method comprises coupling a first support to a second support comprising a magnetic bearing, where the first support is movable relative to the second support along a linear path without the first support contacting the second support, where the magnetic bearing comprises a permanent magnet on the first support; locating a magnetic field adjuster on the first support, where the magnetic field adjuster is configured to move the first permanent magnet and/or vary influence of a magnetic field of the first permanent magnet relative to a second magnet of the magnetic bearing; and connecting a first device to the first or second support, where the supports are configured to move the device, where the first device is configured to support at least one substrate thereon during movement of the first device.

In accordance with another aspect an example method comprises providing a transport comprising: a first support comprising a first capacitive interface; and a second support comprising a second capacitive interface, where the second support is movably connected to the first support along a linear path, and where the first and second capacitive interfaces are sized, shaped and located relative to each other to provide a non-contacting capacitive power coupling and to allow heat transfer between the first and second capacitive interfaces; and connecting a device to the transport, where the device is configured to support at least one substrate thereon while the device is moved by the transport, where the transport is configured to move the device to thereby move the at least one substrate.

In accordance with another aspect, an example embodiment is provided in a non-transitory program storage device readable by a machine, tangibly embodying a program of instructions executable by the machine for performing operations, the operations comprising: determining a distance between a first support and a second support in a transporter, where a first device configured to support at least one substrate thereon is connected to the first support, where the supports are movable relative to one another along a linear path, where the first and second supports are coupled to each other by a magnetic bearing, where the magnetic bearing comprises a first permanent magnet and a second magnet, where the first permanent magnet is connected to the first support, where the transporter comprises a magnetic field adjuster connected to the first support which is configured to move the first permanent magnet and/or vary influence of a magnetic field of the first permanent magnet relative to the second magnet, where the transporter comprises a device connected thereto; and controlling the magnetic field adjuster to substantially maintain the distance between the first and second supports.

BRIEF DESCRIPTION OF THE DRAWINGS

The foregoing aspects and other features are explained in the following description, taken in connection with the accompanying drawings, wherein:

FIG. 3 is a schematic section view of an example substrate transport platform;

FIG. 4 is a partial schematic section view of an example substrate transport platform;

FIG. 7 is a diagram of a power coupling;

FIG. 8 is a diagram of a power coupling;

FIG. 13 is a diagram of a power coupling;

FIG. 14 is a diagram of a power coupling;

FIG. 16 is a partial section of a drive portion;

FIG. 17 is a partial section of a drive portion;

FIG. 18 is a partial section of a drive portion; and

FIG. 19 is a partial section of a drive portion.

DETAILED DESCRIPTION OF EXAMPLE EMBODIMENTS

Figure 1:
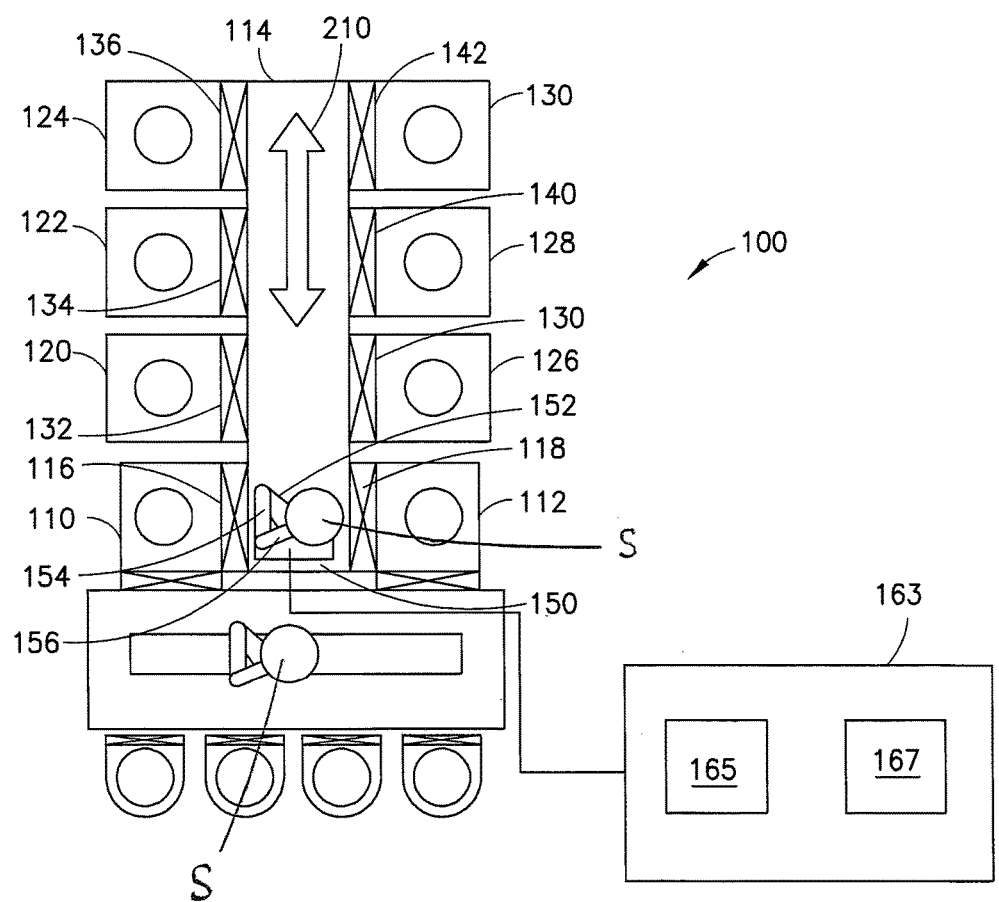
FIG. 1 is a top view of an example substrate transport platform.

Referring to FIG. 1, there is shown a schematic top plan view of an example substrate transport system and robot 100 for substrates, such as substrates S for example. Although features will be described with reference to the example embodiments shown in the drawings, it should be understood that the present invention may be embodied in many forms of alternative embodiments. In addition, any suitable size, shape or type of materials or elements could be used.

The disclosed example embodiment relates to vacuum processing and transport systems for use in the manufacture of semiconductors or other suitable devices. The transport systems shown are directed to systems with rectangular transport chambers but in alternate aspects, the automation may be directed to any suitable system, linear, radial or combinations thereof. Different approaches are considered including providing one or more linear driven substrate supports, one or more linear driven robots and linear driven robots with no or partial service loop. The disclosed are merely exemplary and combinations and subcombinations of the different examples may be provided to optimize for a given application. Conventional robot drives may be combined with linear transport features, such as provided with a single robot that transports wafers to all modules or two or more robots where each transports wafers to of the modules or, for example, where each transports wafers to 2 opposing modules or different modules. Here, different modes of operation may be supported, for example fast swap with one or more two end effector wafer exchange or single with a one end effector wafer exchange. Further, parallel wafer transport and exchange may be provided if 2 or more robots are provided. With such an approach, process module (PM), module, load lock or otherwise may be added to the end of the tool. Here, footprint depends on robot type and providing two or more robots may require additional handoffs. In the approach where a robot drives on linear track, one or more robots may be provided where each transports wafers to some or all modules. A linear track may be provided, for example, a linear drive and slides where the track length may be full or partial depending on the arm design. Here, a service loop may be provided to provide power, communication, and cooling. Alternately, non-contact methods may be provided to provide power, communication, linear guidance, bearing support, propulsion and cooling. Alternately, combinations of contact based and non-contact based methods may be provided to provide power, communication, linear guidance, bearing support, propulsion and cooling. Similarly, many different modes of operation may be provided, for example, fast swap, single or parallel wafer transport and exchange if two or more robots are provided. Here, a sealed and cooled robot enclosure (may be potted and unsealed) may be provided. The linear drive may be any suitable drive, band, linear motor or otherwise. The service loop may be any suitable service loop, for example, stainless bellows or otherwise. With the approach where the robot has no or a limited function service loop, the robot may still drive on a linear track and the system may support one or more robots, for example, where each is capable of transport to all of the modules. In this approach, the dominant cooling may be done by radiation, for example, to a controlled surface. The two surfaces may be coated, for example, with high emissivity coatings and one or both surfaces may be temperature controlled to ensure an acceptable steady state temperature difference. Similarly, the approach supports different modes of operation, fast swap, single or parallel wafer transport and exchange for example, if two or more robots are provided. Here, a low power consuming robot drive may be provided with thermal transfer to the housing or transport chamber. With radiation cooling heat may be transferred to a controlled surface in or of the chamber. With power and communication, an exposed conductive loop, inductive, optical, wireless or other suitable coupling(s) may be provided. The linear drive may be band, linear motor or other suitable motor. The slides may be vacuum compatible bearing, magnetic bearing or other suitable bearings.

Vacuum robots disclosed herein may be provided within the vacuum chamber of transport platforms and may have features as disclosed in U.S. patent application having Ser. No. 13/618,315 entitled "Robot Drive with Passive Rotor" and filed Sep. 14, 2012. Further, vacuum robots may be provided within the vacuum chamber of a platform and may have features as disclosed in U.S. patent application having Ser. No. 13/618,117 entitled "Low Variability Robot" and filed Sep. 14, 2012. Further, vacuum robots may be provided within the a vacuum chamber of a platform and may have features as disclosed in U.S. patent application having Ser. No. 13/833,732 entitled "Robot Having Arm With Unequal Link Lengths" and filed Mar. 15, 2013. Further, vacuum robots may be provided within the vacuum chamber of a platform and may have features as disclosed in U.S. patent applications having Ser. No. 14/295,419 entitled "Robot and Adaptive Placement System and Method" and filed Jun. 4, 2014. Further, vacuum robots may be provided within the vacuum chamber of a platform and may have features as disclosed in U.S. patent applications having Ser. No. 61/825, 162 entitled "Robot with Independent Arms" and filed May 20, 2013. All of the above, referenced applications are hereby incorporated by reference herein in their entirety.

Referring to FIG. 1, there is shown a top schematic view of vacuum transport system 100. System 100 has first and second load locks 110, 112 coupled to vacuum transport chamber 114 by isolation valves 116, 118. Process modules 120, 122, 124, 126, 128, 130 are further coupled to chamber 114 by valves 132, 134, 136, 138, 140, 142 respectively. Vacuum transport robot 150 is coupled to chamber 114 to transport substrates between the load locks and process modules. Vacuum transport robot is shown having two links or arms 152, 154 and rotatable end effector 156. In alternate aspects, more or less arms and/or end effectors may be provided. As a further example, the robot drive may be any suitable robot capable of making compound moves such that the substrate tracks orthogonal to the PM chamber interface. The robot drive may for example, have 2, 3, 4 or 5 rotary axis drive and a z axis drive where the rotary axis drive the shoulder, elbow and two independent wrists. Alternately, more or less additional axes and end effectors may be provided, for example, to support multiple fast swap operations or otherwise. The robot drive 150 is connected to the controller 163 which comprises at least one processor 165 and at least one memory 167 having software code for at least partially controlling movement of the robot 150. The controller 163 as noted above may comprise at least one processor, at least one memory, and software for performing operations, including at least partially controlling movement of the robot, as described herein. Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

The disclosed example embodiment may utilize a non-contact (in whole, or partially in conjunction with both contact and non-contact features), vacuum and clean room compatible transport drive platform providing a modular and configurable transport module that may be utilized across a number of applications within ultra clean manufacturing without the contamination associated with conventional linear drives, for example, utilizing slides or otherwise.

Figure 2:
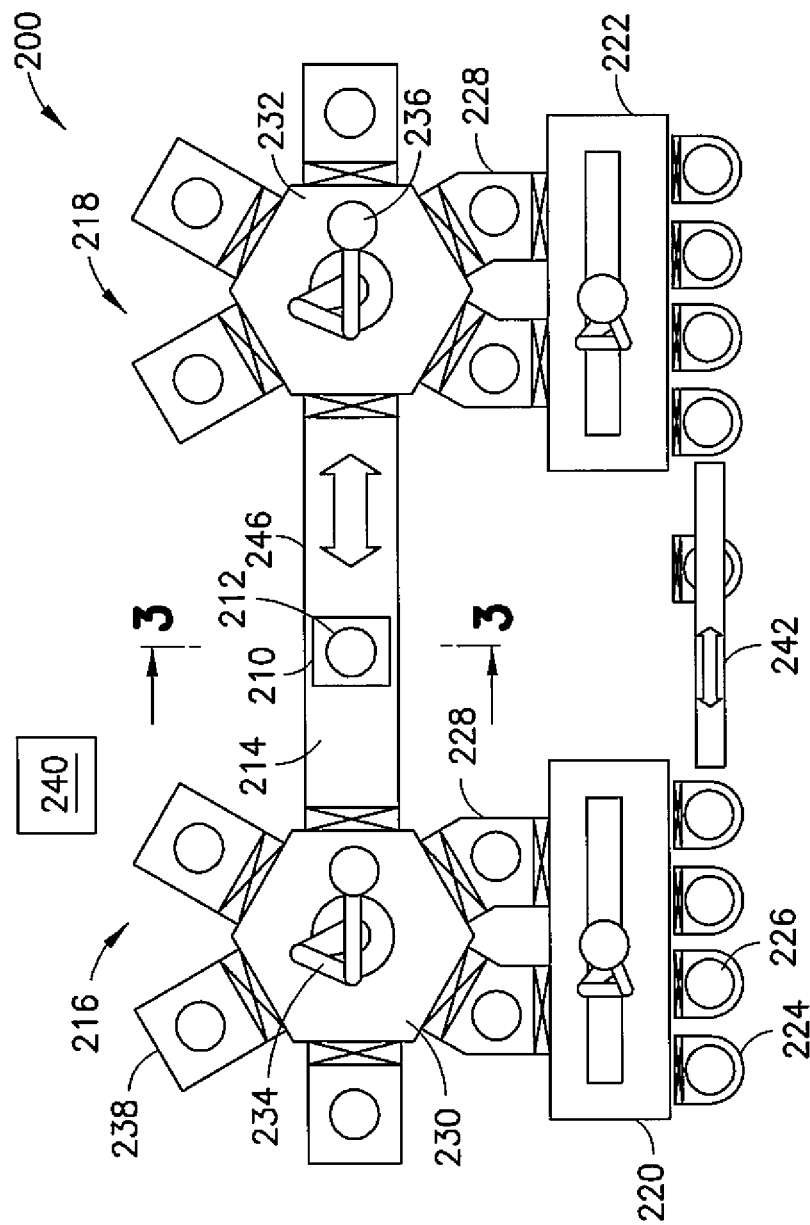
FIG. 2 is a top view of an example substrate transport platform.

In the disclosed example embodiment, a non-contact modular linear drive system is provided for a transport platform that may be adapted to transport single substrates, batches of substrates or substrate transporting automation or robotics as shown in FIG. 1. Referring also to FIG. 2, there is shown a top view of combined systems 200. Here, linear drive 210 may be utilized to directly transport substrates 212 in vacuum or inert atmosphere 214 from tool 216 to tool 218 without exposing the substrates to organic contamination or oxide forming atmosphere, for example as seen. Here, left and right substrate processing platforms 216, 218 are shown. Each platform has an equipment front end module (EFEM) 220, 222 having a mini environment with an atmospheric robot therein, load ports 224 supporting substrate carriers 226, load locks 228 coupled to the EFEM with isolation valves, vacuum transport chambers 230, 232 coupled to the load locks by isolation valves, vacuum robots 234, 236 in the vacuum transport chambers, process modules 238 coupled to the transport chamber with isolation valves and a controller 240. Typically, substrates are processed in each tool in the process modules where transport from tool to tool involves transporting the substrate from the process module, through the transport chamber, load lock, EFEM and into carriers. The carriers are then transported from the load port by an automated material handling system (AMHS) 242 to the next tool's load port. The substrates may then be picked from the load port, transported through the EFEM into the load lock, pumped down, and then transported from the load lock to the next process module by the vacuum robot. This process is time consuming and exposes the substrate to atmosphere, for example, causing the growth of native oxide or contamination. As an alternative, a tube 246 may be provided with the disclosed linear drive transporting substrates or a carrier with a number of substrates 212 in a vacuum or inert environment 214 directly from the vacuum transport chamber of the first tool 216 to the second tool 218. This transport arrangement eliminates the additional handling steps and also eliminates exposure of the substrates to atmosphere. The configurable drive may further be utilized to directly transport substrate handling robotics from process module to process module forming a tool level transport platform within a vacuum or inert environment, for example as seen in FIG. 1 and by way of further example, as previously disclosed. As will be described, the modular linear drive system has a non-contact magnetically supported guidance subsystem, a non-contact magnetically driven forcer subsystem, a moving support subsystem and an advanced control subsystem. The linear drive system provides a fundamental building block to facilitate particle free substrate transport from tool to tool in a vacuum or inert environment eliminating oxide growth and significantly reducing non-value added time between process steps, for example as seen in FIG. 2. The linear drive system further provides a fundamental building block to facilitate configurable and expandable particle free substrate transport between individual process modules within a vacuum or inert environment, for example, as seen in FIG. 1. Although the subsystems will be described in greater detail below, elements or aspects of the subsystems may be combined, for example, with earlier described subsystems or aspects of the disclosed embodiment, in any suitable combination.

Referring now to FIG. 3 and FIG. 4, there is shown a cross section of a non-contact magnetically supported guidance subsystem 210. The modular linear drive, system utilizes a non-contact magnetically supported guidance subsystem. The subsystem has stationary passive opposing magnetic stainless steel guide rails or stationary supports 310, 312. As the guide rails are passive, multiple supports may utilize the same rail in an autonomous fashion. In alternate aspects, other guide rail arrangements, more or less may be provided and mounted in alternate arrangements, for example, on a wall or floor of the chamber 246. Coupled to the moving support 314 are opposing magnetic bearings 316, 318. Each of the opposing magnetic bearings may have six electromagnets 320 and six inductive gap sensors 322. In one aspect, three magnetic bearings are shown with three additional magnetic bearings spaced there from making up six magnetic bearings on each side. In alternate aspects, more or less bearings or gap sensors may be provided. For example, bearing 318 may have two spaced pairs of three magnetic actuators (two spaced pairs of opposing vertical actuators 318" and two spaced single actuators 318') while bearing 316 may have two spaced single horizontal actuators 316' and a single pair of opposing vertical actuators 316". In this example, four horizontal actuators between the two spaced rails may be provided to control two degrees of freedom and three pairs of opposing vertical actuators may be provided to control an additional three degrees of freedom. Voltage may be selectively applied by the advanced control subsystem to the electromagnets to attract a given coil 320 to the corresponding magnetic stainless steel guide rail 310, 312. The coils may incorporate ferrous and/or magnetic cores. The inductive gap sensors detect the gap 324 between the electromagnets and the corresponding magnetic stainless steel guide rail providing position feedback to the advanced control subsystem. In alternate aspects, any suitable gap sensors or position sensors may be provided. The advanced control subsystem maintains a fixed gap 324, 326 between the opposing magnetic stainless steel guide rails and the opposing magnetic bearings controlling five degrees of freedom and allowing the support 314 to be guided along the opposing magnetic stainless steel guide rails 310, 312 without contact. In alternate aspects, the gap may be variable, or no gap may be provided, for example, where a gap is provided for a period and the control subsystem allows for the guided support to be controllably set down on the guide rails.

The modular linear drive system 210 may utilize a non-contact magnetically driven forcer subsystem 330, 332. The subsystem 330, 332 has two linear motor modules 334, 336 and two position feedback modules 338, 340, each corresponding to one of the stationary passive opposing magnetic stainless steel guide rails 310, 312. Each linear motor module has a stationary passive magnetic stainless steel secondary 342, 344 shown part of the stationary passive opposing magnetic stainless steel guide rails 310, 312. The stationary passive magnetic stainless steel secondary may have a toothed portion that interacts with the corresponding primary forcer and may or may not also have magnets. As each secondary is passive, multiple supports may utilize the same secondary in an autonomous fashion. Each linear motor module has a primary forcer 334, 336 coupled to the support 314 where the primary forcer may have three phase windings and permanent magnets. In alternate aspects, permanent magnets may be provided as part of driven member 314 for the purpose of offsetting gravity and dynamic loads. In alternate aspects, permanent magnets may be provided as part of one or more of the magnetic bearings for the purpose of offsetting gravity and dynamic loads. An example of a potential primary forcer and secondary topology is provided with the Siemens 1FN6 Design. In alternate aspects, any suitable forcer may be provided. The permanent magnets of the forcers 334, 336 are provided as a component that both facilitates efficient generation of thrust (coupled with windings) and also offsets the payload such that the magnetic bearings minimize the use of power during normal operation. Here, the attractive force between the forcer and the corresponding passive rail may be set at a nominal gap 324 such that the force offsets gravity induced forces resulting in minimum power consumption. Further, the set point for the gap may be varied such that as the payload changes, the gap is adjusted such that the force offsets gravity induced forces resulting in minimum power consumption as the payload changes. For example, the gap on the left forcer may be varied independently of that of the right forcer. Voltage is selectively applied by the advanced control subsystem to the magnetic coils of the primary forcer to produce thrust to the support relative to the stationary passive magnetic stainless steel secondary. Each stationary passive magnetic stainless steel secondary is mounted with teeth oriented vertically down such that the attractive force of the primary forcer's permanent magnets may offset the weight of the support and the payload to minimize the DC component that needs to be applied by the vertical coils of the non-contact magnetically supported guidance subsystem. The subsystem further has an inductive position feedback device 338, 340 that provides, for example, two sine waves in quadrature with respect to each other and corresponding to the position of the primary forcer relative to the stationary passive secondary. In alternate aspects, any suitable position feedback device may be provided with any suitable output, analog, digital or otherwise. The position signal is provided to the advanced control subsystem for position control and for commutation of the corresponding primary forcer. An example of a suitable position feedback device is disclosed in Hosek M., System and Method for Position Sensing, U.S. patent application Ser. No. 13/599,930, Aug. 30, 2012 which is hereby incorporated by reference herein in its entirety. The advanced control subsystem maintains position between the two of the primary forcer and stationary secondary allowing the support to be selectively driven along the opposing magnetic stainless steel guide rails without contact.

The modular linear drive system may utilize a thermally managed moving support subsystem 314. The moving support serves to house all or portions of the advanced control subsystem. The moving support further serves to house or support one or more substrates for transport. The moving support further serves to house or support a robotic transfer arm that cooperates with the moving support to transport one or more substrates between locations. As there are active components coupled to the moving support, the heat generated by the active components must be dissipated by a thermal management subsystem. For a moving support in vacuum, heat may be dissipated either by radiation or by transfer through a medium, for example through a gas or by coupling a bellows to the moving support and circulating gas or liquid coolant through a chiller. In the event of cooling by radiation alone (or combination radiation and convection), an allowable temperature difference between all or part of the moving portion and the chamber may be specified, for example, 50 degrees C. or otherwise. Non-contacting interleaving fin like structures 350, 352 may be employed to maximize opposing surface areas and high emissivity coatings may be utilized to maximize surface area related heat transfer. An example of suitable coating may be aluminum oxide, aluminum nitride or any suitable high emissivity coating. In alternate aspects, any suitable surface or coating may be provided. For a moving support in a gas or inert environment, heat may be dissipated either by radiation or convection or both. As there are active components coupled to the moving support, power and communication must be transferred to the moving support subsystem with a power coupling 356 and communication coupling 358. Power and communication may be transferred to the moving support subsystem 314 wirelessly, by inductive coupling, via service loop or a combination of these approaches. Here, active components coupled to the support may be potted with vacuum compatible potting or epoxy or alternately be hermetically sealed within an enclosure or a combination of both. Examples of suitable moving support thermally sunk subsystems are disclosed in Hosek M., Hofmeister C., Low Variability Robot, U.S. patent application Ser. No. 13/618, 117, Sep. 14, 2012, which is hereby incorporated by reference herein in its entirety.

The modular linear drive system may utilize a non-contact power coupling 356 and a non-contact communication link 358. The non-contact wireless power coupling 356 may be an inductive power coupling having a primary coil coupled to the vacuum chamber and a secondary coil coupled to the moving support. The secondary may move adjacent the primary as disclosed in Hosek M., Hofmeister C., Low Variability Robot, U.S. patent application Ser. No. 13/618, 117, Sep. 14, 2012 which is incorporated by reference herein in its entirety. A circuit in the power electronics rectifies and conditions the power drawn from the secondary. Communication between a controller external to the chamber and the power electronics on board the moving support may also be via the inductive power coupling. Alternately, wireless and optical couplings or any suitable coupling may be provided.

The modular linear drive system may utilize power electronics 360 on board the moving support. The power electronics serve as circuitry associated with the inductive coupling, for example, data transmission, power rectification and conditioning. The power electronics also serve to provide controlled power to the actuators associated with guidance actuators and linear motors. The power electronics also have appropriate inputs and outputs to monitor transducers, for example, feedback transducers, temperature transducers or otherwise. The power electronics also have a CPU and memory and other sufficient circuitry to process data and interface with the external controller, actuators, transducers or otherwise as required.

The modular linear drive system may utilize an advanced control subsystem. From a hardware perspective, the platform includes multi axis 4 quadrant PWM amplifiers, high speed analog and digital I/O, power supplies, CPU and memory. Algorithms for real time control may be coded in C++ running on Linux or otherwise. Amplifiers, other I/O and other peripheral devices may be added over a high speed EtherCat network. The controller platform executes a closed loop control algorithm that maintains a fixed gap between the opposing magnetic stainless steel guide rails and the opposing magnetic bearings while selectively driving the linear forcers to translate the moving support. The closed loop control algorithm may be a Multi Input Multi Output control dynamic model based algorithm and compensates for external disturbances. By way of example, such external disturbances may be by means of the payload transported such as a robotic arm. Here, the controller may control both the robotic arm as well as the guidance and forcer subsystems.

The modular vacuum compatible non-contact linear drive system may provide the following features. One feature may include the elimination or reduction of particulate generation associated with conventional rails or linear bearings facilitating cleanliness requirements for semiconductor manufacturing. Another feature includes providing a modular expandable platform where process capacity of multiple tools may be integrated on a single platform resulting in footprint reduction and elimination of redundant automation and support subsystems. Another feature includes elimination of moving parts, wear and failures associated with conventional rails or linear bearings facilitating reliability requirements associated with semiconductor manufacturing. Another feature includes elimination of outgassing associated with grease utilized with conventional rails or linear bearings. Another feature includes where the system supports parallel operation of multiple supports and/or robots within the same workspace not possible with fixed vacuum robots. Another feature includes compensation for arm deflection not possible with fixed vacuum robots. Another feature includes the ability to support modular expansion of vacuum transport platforms. Another feature includes the ability to support direct tool to tool vacuum substrate transport facilitating reduced cycle time particularly in a small lot, high mix manufacturing environment. Another feature includes where the technology may be utilized across a broad range of applications with respect to semiconductors, flat panel displays, LED's and solar cell manufacturing and particularly in a small lot, high mix manufacturing environment.

Figure 5:
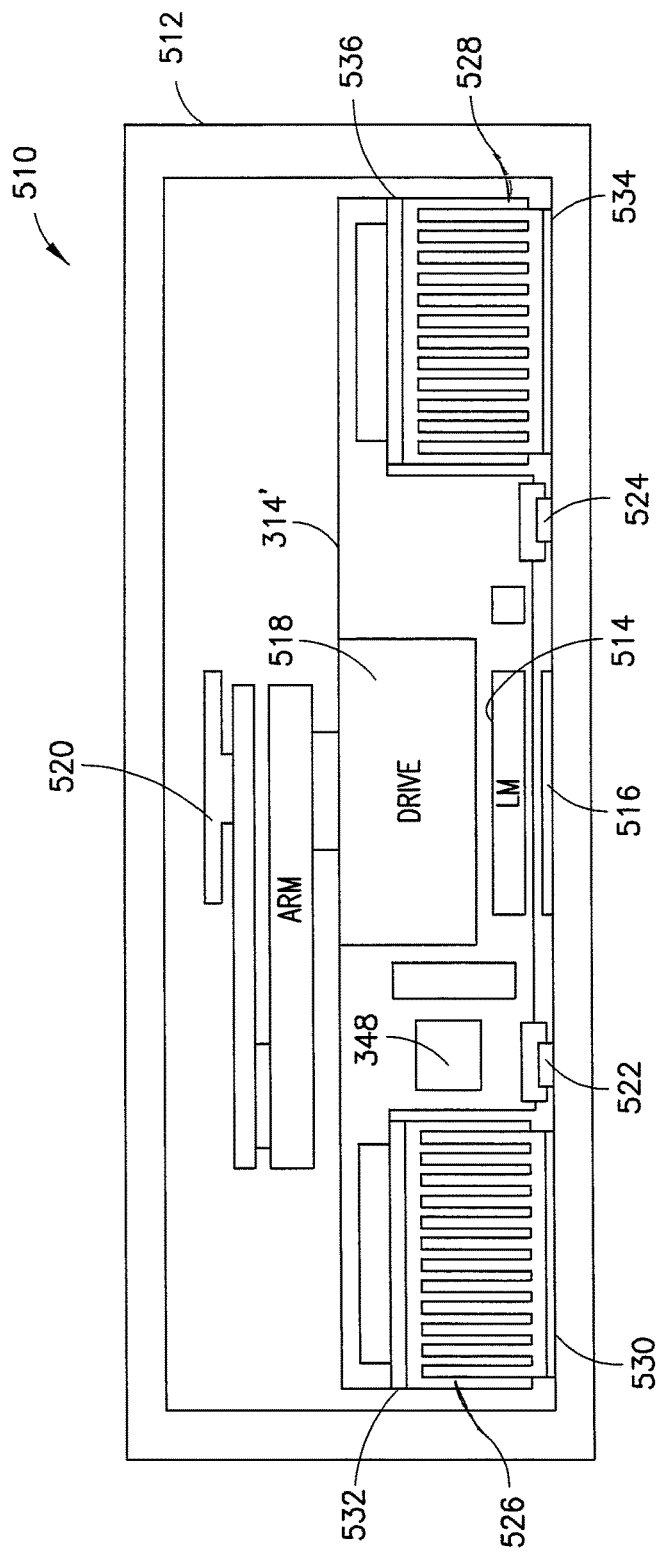
FIG. 5 is a schematic section view of an example substrate transport platform.

Referring now to FIG. 5, there is shown a schematic section view of system 510. System 510 has chamber 512 and drive subsystem 314'. Drive subsystem 314' may have features as described with respect to system 314, 210 or as described herein. Drive subsystem 314' may be driven by a linear motor having active forcer/primary 514 and passive secondary 516 (may or may not have magnets). Drive subsystem 314' may further have robot drive 518 and arm 520. Drive subsystem 314' may be linearly coupled to chamber 512 by slides 522, 524 where slides 522, 524 may be magnetic or conventional ball or roller slides or any suitable slide. System 510 has an active cooling system 348 where active cooling system 348 transfers heat from active components within drive subsystem 314' to chamber 512 through non-contact interleaved radiators 526, 528. Interleaved radiators 526, 528 may each have a first portion that is coupled to and extends the length of the chamber or supporting surface and a second portion that is coupled to the moving subsystem 314'. Here the first portion overlaps the second portion and the second portion travels along the length of the first portion being shorter than the first portion. In the embodiment shown, non-contact interleaved radiators 526, 528 may be electrically insulated from one or both of chamber 512 and the housing of subsystem 314' with electrical insulators 530, 532, 534, 536 such that non-contact interleaved radiators 526, 528 may also act as opposing surfaces of capacitors to facilitate capacitive based power transfer as will be described with respect to FIG. 8. Although interleaved radiators 526, 528 have an interleaved shape as shown, any suitable shape or opposing surfaces, interleaved or not may be provided.

Figure 6:
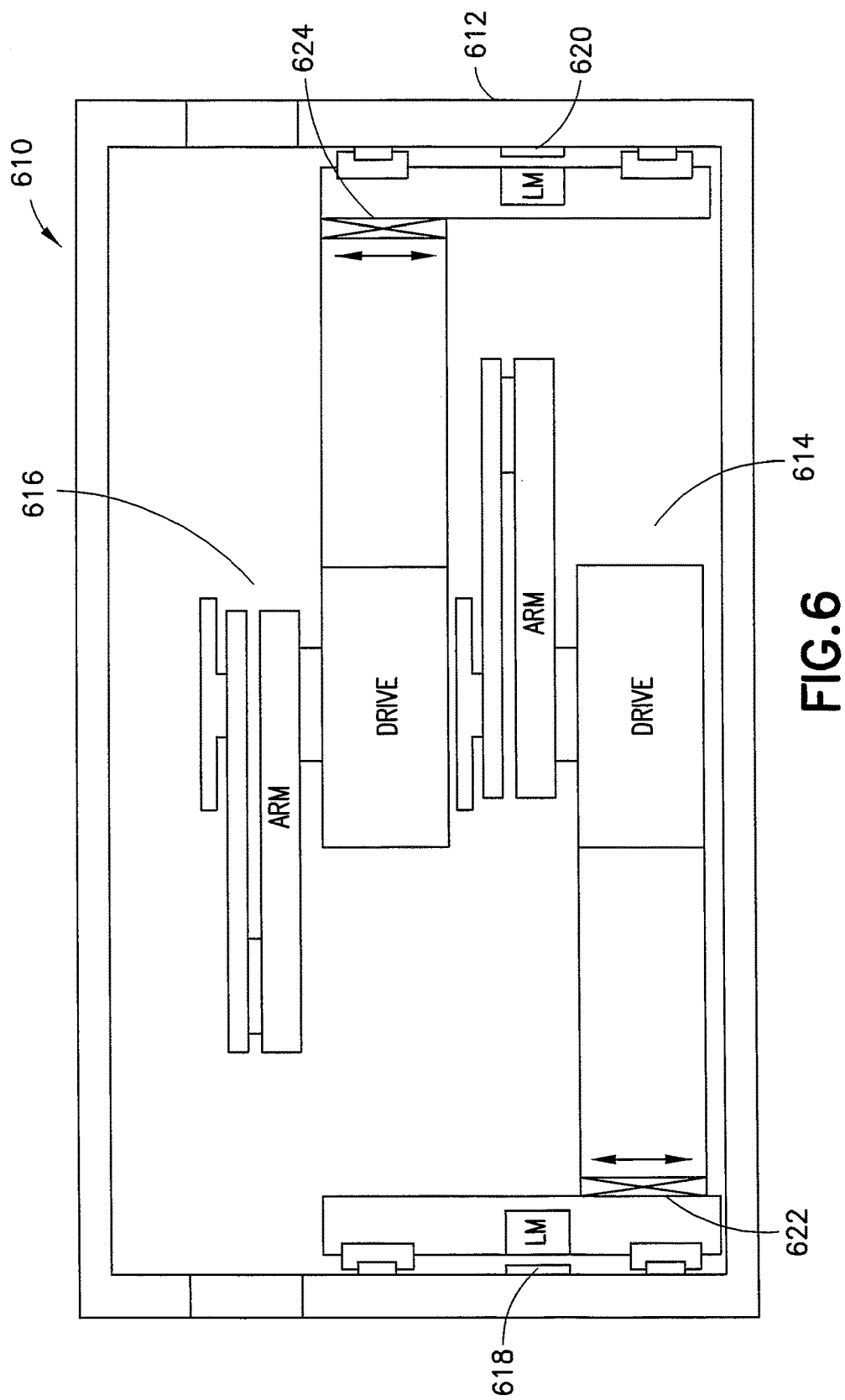
FIG. 6 is a schematic section view of an example substrate transport platform.

Referring now to FIG. 6, there is shown a schematic section view of system 610. System 610 has chamber 612 and drive subsystem 314". Drive subsystem 314" may have features as described with respect to system 314', 314, 210 or as described herein. Drive subsystem 314" may have two independently driven robots 614, 616 that can move linearly with linear drives 618, 620 and vertically with vertical or Z drives 622, 624 such that independently driven robots 614, 616 may avoid each other by moving in the z direction. In alternate aspects, more or less than two independently driven robots may be provided with more or less features. For example, a single robot may be provided without a vertical or Z drive and one or more robots may be provided with a vertical or Z drive.

Referring now to FIG. 7, there is shown a diagram of a contactless power coupling 356 for a vacuum robot drive unit that provides power from an AC power source 710 in atmosphere 712 to a moving enclosure 714 within a vacuum chamber 716 in a non-contact manner. The description may be for either an inductive or capacitive coupling however other suitable non-contact power coupling techniques may be provided. The coupling accepts wide range voltage input into an AC-DC-AC driver circuit 710. The AC-DC-AC driver circuit 710 has a AC-DC converter and may have driving circuit, for example, a resonant driving circuit connected to a vacuum feed through 718. In alternate aspects, any suitable driving circuit may be provided. The vacuum side of the feed through is connected to a stationary primary 720 that is driven by the resonant circuit driver through the vacuum feed through 718. A moving secondary 722 is constrained to move along a linear path within the vacuum chamber 716 and tracks the stationary primary 718 picking up power from the stationary primary 718. The moving secondary 722 is sealed to an enclosure and connected to an AC-DC converter 724 within the sealed enclosure. The AC-DC converter 724 may have a driven circuit, for example, a resonant driven circuit and converts AC supplied by the moving secondary to a regulated DC output 726. In alternate aspects, any suitable driven circuit may be provided. Referring also to FIG. 8, there is shown a diagram of a contactless power coupling that utilizes capacitive coupling through radiators 526, 528. Depending on geometry and pressure, the output/voltage level between the primary and secondary may be driven in a manner for prevention of arcing or discharge from the primary or other components to ground or other components within the vacuum environment. Higher voltages may be used if the appropriate hermetic insulation with the appropriate dielectric strength is applied to conductors of the primary and secondary. In the embodiment shown, power is transferred from an AC source 710 to a load 710' through capacitors 526, 528 formed by parallel plates or opposing surfaces, for example, interleaved radiators or otherwise from a driving ac source 710 to a load 710'. In one aspect, the coupling may be a series resonant converter circuit having driving portion 710 that may be a voltage drive H-bridge or other driver with inductors in series with coupling capacitors 526, 528 with load 710' having an AC-DC conversion circuit, for example, a rectifier circuit copied to a load, for example, subsystems within system 314'. In alternate aspects, any suitable driver or driven circuit may be provided.

Figure 9:
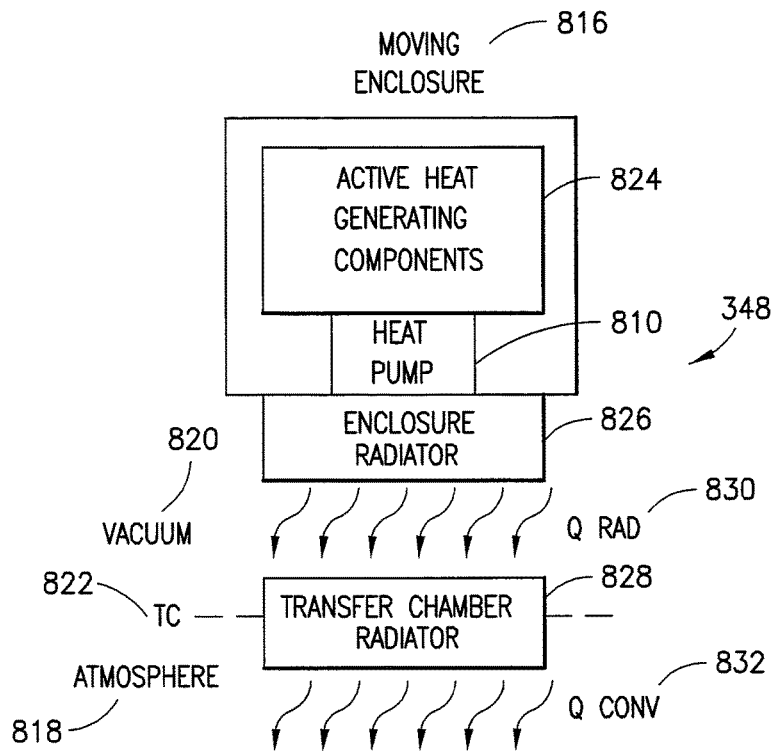
FIG. 9 is a diagram of an example substrate transport platform.
Figure 10:
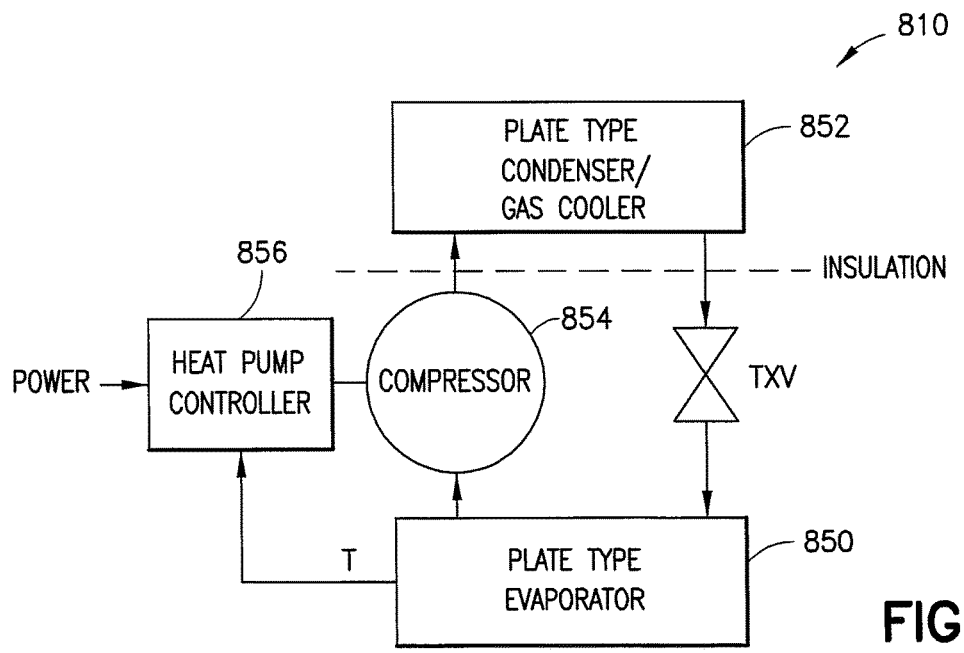
FIG. 10 is a diagram of a heat pump.
Figure 11:
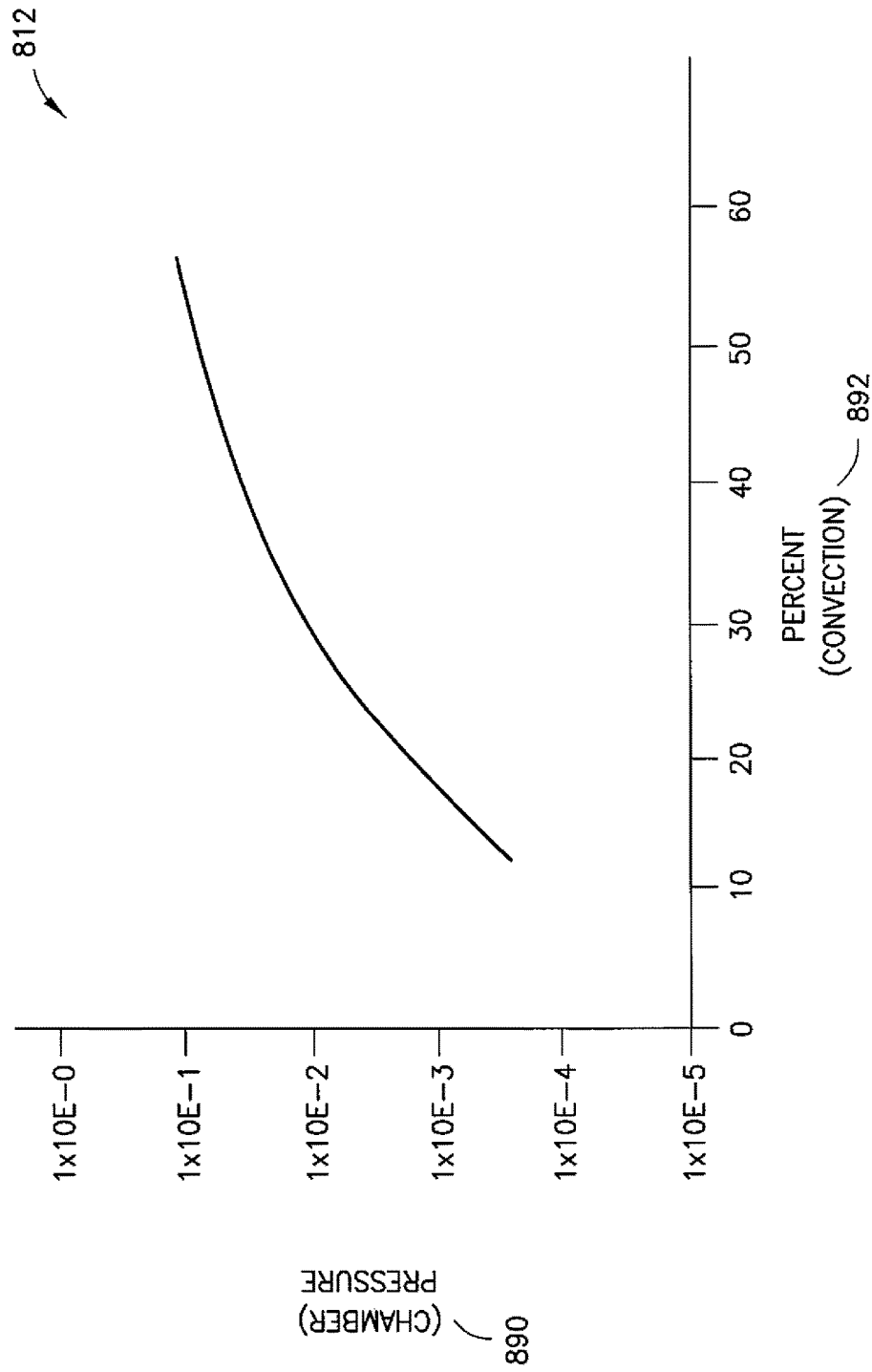
FIG. 11 is a pressure versus heat transfer percentage graph.

Referring now to FIG. 9, there is shown a diagram of a contactless active cooling system 348. Referring also to FIG. 10, there is shown a diagram of a heat pump 810. Referring also to FIG. 11, there is shown a pressure versus heat transfer percentage graph 812. System 348 transfers heat from moving enclosure 816 within vacuum or other environment within chamber 822 to atmosphere 818. Heat is pumped by heat pump 810 from heat generating components 824 to enclosure radiator 826 where enclosure radiator 826 transfers heat to transfer chamber radiator 828 by radiation and/or radiation and convection. Transfer chamber radiator 828 transfers heat to atmosphere 818 via convection 832 or otherwise through chamber 822. With interleaved radiators, the surface areas of the two radiators are exposed with a favorable view factor for radiation as well as in close proximity to take advantage of any convection effects that may be available. For example, as seen in FIG. 11, as chamber pressure 890 decreases, the percent of heat transfer due to convection 892 between the interleaved opposing radiators decreases. By way of example, at high vacuum, the amount of heat transfer due to convection approaches 0. By way of further example, at roughing pressure of approximately 10 mTorr, the amount of heat transfer due to convection may be about 25%. By way of further example, at roughing pressure of approximately 100 mTorr, the amount of heat transfer due to convection may be about 50%. The percentage is dependent on surface geometry, proximity of surfaces, pressure, gas species and otherwise. In alternate aspects any suitable geometries may be used and may have higher or lower percentages. Referring also to FIG. 10, heat pump 810 may be a R134a or other vapor compression heat pump for the linear vacuum drive unit and provides cooling of electronics and other heat dissipating components in a sealed moving enclosure. Alternately no heat pump may be provided or any suitable heat pump may be provided, for example, thermoelectric or otherwise. Heat pump 810 may use a sub critical vapor compression cycle. The heat pump pumps heat within a moving enclosure 816 within a vacuum chamber 822 from a plate evaporator 850 to a plate condenser 852 that is thermally sunk to a radiating surface 826 on an exterior of the moving enclosure 816. All of the active components of the heat pump may be enclosed within the enclosure 816 such that any heat generated or inefficiency resulting from the compressor 852, controller 856 or otherwise needs to be pumped in addition to active heat generating component 824 thermal load.

Figure 12:
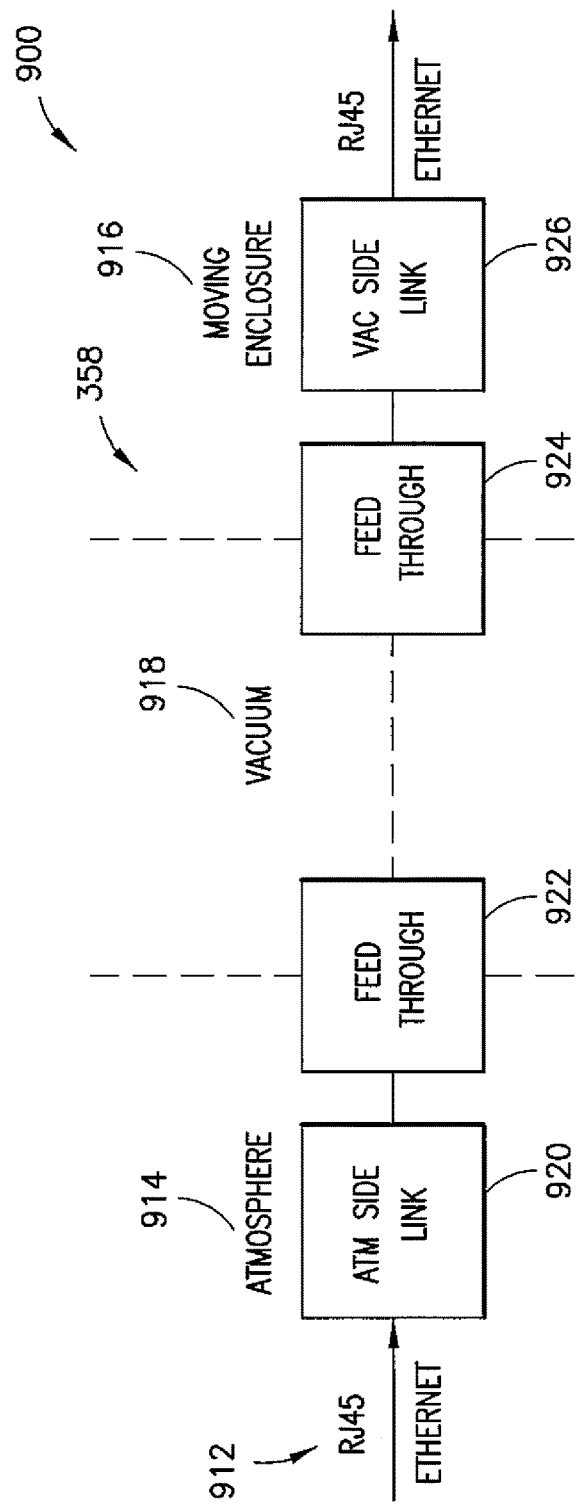
FIG. 12 is a diagram of a communication coupling.

Referring also to FIG. 12, there is shown a diagram of contactless communication system 358. Contactless communication system 358 for the vacuum robot drive unit provides communication from a controller 912 in atmosphere 914 to and from a moving enclosure 916 within a vacuum chamber 918 in a non-contact manner. Any suitable coupling may be provided, for example an optical, inductive or capacitive coupling however other suitable non-contact communication coupling techniques may be provided. The coupling accepts wide range voltage input into an Ethernet link 920 connected to a vacuum feed through 922. A moving enclosure 916 is constrained to move along a linear path within the vacuum chamber 918. The moving enclosure 916 is sealed with a second feed through 924 and has a second Ethernet link 926 within the enclosure. The two links communicate with each other and create a point to point connection in a contactless manner via Ethernet or EtherCAT control network.

Referring to FIG. 13, there is shown a diagram of a contact based power coupling 1010. Coupling 1010 utilizes conductive bands 1012 (one shown) that are tensioned between pulleys 1014, 1016 that are electrically isolated from the transfer chamber 1018. Power 1020 is transferred to the moving enclosure 1022 through the tensioned bands 1012 to contacts 1024. Referring also to FIG. 14, there is shown a diagram of a contact based power coupling 1050. Coupling 1050 utilizes two conductive bands 1052, 1054 that are tensioned between two pulleys 1056, 1058 that are electrically isolated from the transfer chamber 1060. Power is transferred to the moving enclosure 1062 through the two tensioned bands 1052, 1054 to contacts 1062, 1064. Each band tensioner 1056, 1058 tensions and takes up slack, for example, with a torsional preload, in the respective band as moving enclosure 1062 is displaced.

Figure 15:
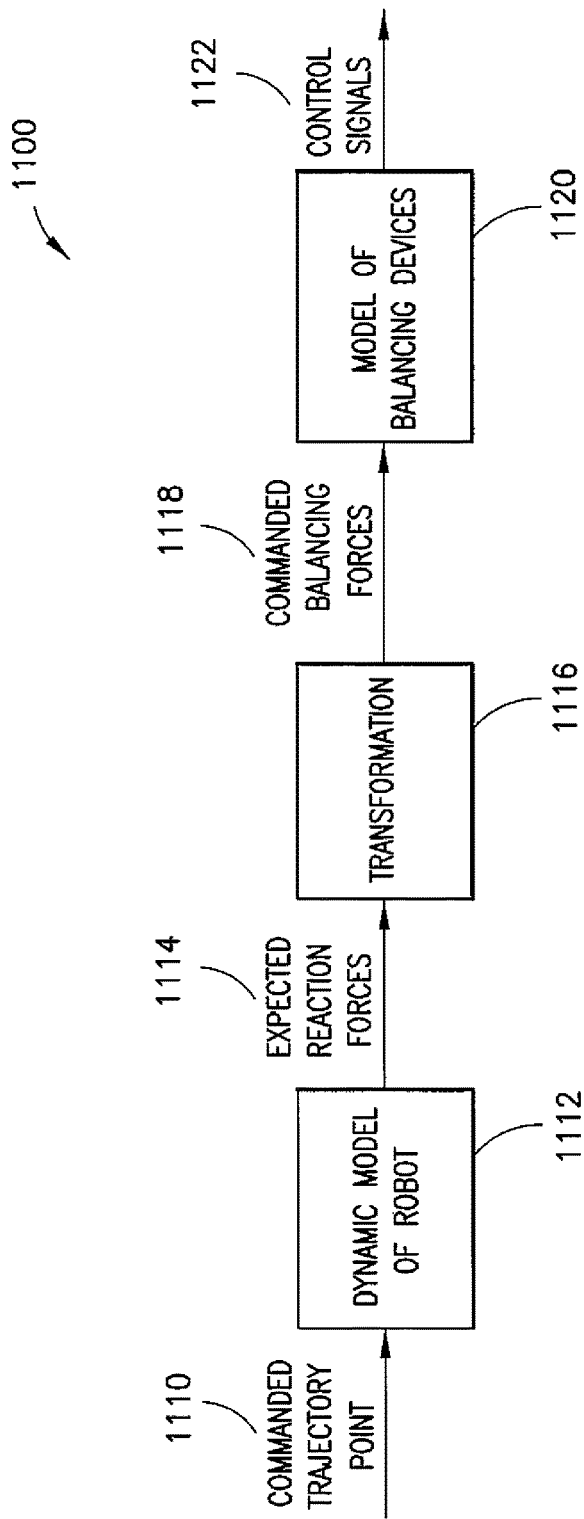
FIG. 15 is a diagram of a control algorithm.

Referring now to FIG. 15, there is shown a diagram 1100 of a control algorithm for energy efficient balancing of reaction forces in magnetically levitated system. The control system may utilize the following method to control the devices that balance reaction forces in a magnetically levitated system: The method uses commanded trajectory points 1110 calculated periodically by the control system, for instance, at the sampling rate of the control system, which may include the commanded positions, velocities and accelerations in the joint space, end-effector space, in any combination of thereof, or in any other conveniently defined coordinate space. Each commanded acceleration point may serve as an input to a dynamic model 1112 of the robot, which may calculate the expected reaction forces 1114 between the robot and the frame (rails), for example, in locations of the magnetic bearings. The expected reaction forces may then be transformed 1116 to the commanded balancing forces 1118 in the locations and directions applicable to the balancing devices, typically normal to the effective surfaces of the balancing devices. And, finally, the method may utilize models of the balancing devices 1120 to convert the commanded balancing force associated with each balancing device to the control signal 1122 for the corresponding balancing device. As an example, the control signal may represent the position of an element in a magnetic circuit of the balancing device required to achieve the commanded balancing force. In this particular example, another open-loop or closed-loop control algorithm may be employed to achieve the required position of the element in the magnetic circuit.

Magnetically levitated systems have features that may be useful in clean, vacuum and harsh environments as they may eliminate the drawbacks of mechanical bearings, including the presence of friction, need for lubrication, generation of particles and sensitivity to aggressive agents. However, these features may typically achieved at the cost of increased energy consumption due to active suspension forces that constantly need to counteract gravity effects, which may change during operation of a magnetically levitated system, for instance, as the payload and/or extension of a robotic arm on a magnetically levitated platform change. The present embodiment provides a solution for balancing of such reaction forces that considerably reduces active suspension forces and, therefore, the energy consumption of a magnetically levitated system.

The present embodiment utilizes passive magnetic forces produced in one or more carefully designed magnetic circuits with permanent magnets to provide major components of suspension forces in a magnetically levitated system, thus reducing the contribution of active suspension forces and the energy consumption associated with them. By adjusting certain properties of the magnetic circuits, the passive magnetic forces may be controlled to respond to changes in the magnetically levitated system, for example, as the payload and/or extension of a robotic arm on a magnetically levitated platform change. This control may be provided by a coil of the magnetic circuit as a magnetic field adjuster based on a model of the magnetically levitated system, on the magnitudes of the active components of the suspension forces, or on a combination of the two methods.

In one embodiment, a first ferromagnetic element may be present on a stationary part of a magnetically levitated system and a second ferromagnetic element may be present on a suspended portion of the magnetically levitated system in the vicinity of the first ferromagnetic element. The first and second ferromagnetic elements may be of a rectangular shape, wedge shape, or may be of any other suitable form that results in a substantially uniform gap between the facing surfaces of the first and second ferromagnetic elements. Alternatively, the shapes of the ferromagnetic elements may result in a non-uniform gap. One or more permanent magnets and other ferromagnetic components may be utilized to produce a magnetic circuit with magnetic force acting across the gap between the first and second ferromagnetic elements. An additional arrangement may be employed to adjust the gap and/or overlap between the first and second ferromagnetic elements, for instance, by shifting or rotating one of the two ferromagnetic elements, thus controlling the magnitude of the magnetic force between the two ferromagnetic elements. As an example, a self-locking lead screw mechanism, worm drive or another suitable self-locking arrangement, which does not require energy to remain in a given position, may be used for this purpose.

In an alternative embodiment, each magnetic circuit may comprise two permanent magnets, at least one of which may be moveable, for instance, pivotable, to control the alignment of the poles of the two magnets. When the north and south poles of the two magnets oppose each other, the magnetic fields of the two magnets cancel out and there is no resultant magnetic force between the stationary part and suspended portion of the magnetically levitated system. When they are aligned, the magnitude of the resultant magnetic force is maximized. By adjusting properly the alignment of the two magnets, the magnitude of the resultant magnetic force may be controlled in a continuous manner.

Multiple magnetic circuits based on either embodiment or their combination may be utilized to balance the effects of gravity forces. For instance, three magnetic circuits may be employed to affect lift, pitch and roll of the system.

The disclosed may use opposing linear motors. In alternate aspects, the use of magnetic circuits with permanent magnets independent of the linear motors may be used.

Such magnetic circuits can counteract the dynamic effects of the moving arm by (1) adjusting the size of the gap, (2) adjusting the cross-section of the gap by varying overlap and/or (3) adjusting relative orientation of a pair of interacting magnets.

Referring now to FIG. 16, there is shown a partial cross section of a non-contact magnetically supported guidance subsystem 1210 that may have features similar to that of system 210 shown in FIG. 4. The subsystem has stationary passive opposing magnetic stainless steel guide rails 1212 (one side shown). As the guide rails are passive, multiple supports may utilize the same rail in an autonomous fashion. Coupled to the moving support 1214 are electromagnets and gap sensors 1216. In alternate aspects, more or less bearings or gap sensors may be provided. Voltage may be selectively applied to attract a given coil to the corresponding magnetic stainless steel guide rail. The control subsystem may maintain a fixed or variable gap 1218, 1220 between the opposing magnetic stainless steel guide rails and the opposing magnetic bearings controlling five degrees of freedom and allowing the support 1214 to be guided along the opposing magnetic stainless steel guide rails. The linear drive system 1210 utilizes a non-contact magnetically driven forcer subsystem 1222 that may have linear motor modules having a stationary passive magnetic stainless steel secondary 1224 shown part of the stationary passive opposing magnetic stainless steel guide rails 1212. Each linear motor module has a primary forcer 1222 coupled to the support 1214 where the primary forcer may have three phase windings and permanent magnets that attract forcer 1222 to secondary 1224 as a function of gap 1218 and may offset loads, for example due to gravity. Here, the gap may be controlled for the magnet to act as a balancing device to minimize energy expended. In alternate aspects, permanent magnets may be provided as any part of driven member 1214 for the purpose of offsetting gravity and dynamic loads. Here, forcer 1222 is provided as a component that both facilitates efficient generation of thrust (coupled with windings) and also offsets the payload such that the magnetic bearings minimize the use of power during normal operation. Here, the attractive force between the forcer and the corresponding passive rail may be set at a nominal gap 1218 or controlled otherwise such that the force offsets gravity induced forces resulting in minimum power consumption. Further, the set point for the gap may be varied such that as the payload changes, the gap is adjusted such that the force offsets gravity induced forces resulting in minimum power consumption as the payload changes. For example, the gap on the left forcer may be varied independently of that of the right forcer. In this manner, the balancing device may comprise permanent magnets and electromagnetic actuators physically coupled to the moving member 1214 and varying a gap between the moving member and the rail may minimize the use of power for support.

Referring now to FIG. 17, there is shown a partial cross section of a non-contact magnetically supported guidance subsystem 1210' that may have features similar to that of system 1210 shown in FIG. 16. In FIG. 17, balancing device 1240, 1242 may comprise a magnet 1244, 1246 that is controllably moveable by actuators 1248, 1250 relative to moveable support 1214 such that as the magnet is moved closer or further from rail 1212, the force correspondingly increases or decreases to offset static or dynamic loads that the electric actuators would otherwise have to support. Here, the permanent magnets and electromagnetic actuators are physically coupled to the moving member with the permanent magnets moveable relative to the rail and moving member and varying a gap between the permanent magnets and the rail facilitates keeping the gap 1218, 1220 between the rail and the moving member fixed.

Referring now to FIG. 18, there is shown a partial cross section of a non-contact magnetically supported guidance subsystem 1210" that may have features similar to that of system 1210, 1210' shown in FIGS. 16 and 17. In FIG. 18, balancing device 1260, may comprise a magnet 1262 that is controllably moveable by actuator 1264 relative to moveable support 1214 such that as the magnet is moved closer or further from rail 1212 i.e. overlapping the rail, the force correspondingly increases or decreases to offset static or dynamic loads that the electric actuators would otherwise have to support. Here, the permanent magnets and electromagnetic actuators are physically coupled to the moving member with the permanent magnets moveable relative to the rail and moving member and varying a overlap between the permanent magnets and the rail facilitates keeping the gap 1218, 1220 between the rail and the moving member fixed.

Referring now to FIG. 19, there is shown partial cross section of a non-contact magnetically supported guidance subsystem 1210''' that may have features similar to that of system 1210, 1210', 1210" shown in FIGS. 16, 17 and 18. In FIG. 19, balancing device 1280, may comprise a magnet 1282 that is controllably moveable by actuator 1284 relative to moveable support 1214 such that as the magnet is rotated, the field between magnetic poles 1286, 1288 and rail 1212 is increased or decreased as a magnetic field adjuster such that the force correspondingly increases or decreases to offset static or dynamic loads that the electric actuators would otherwise have to support. Here, the permanent magnets and electromagnetic actuators are physically coupled to the moving member with the permanent magnets rotateable relative to the rail and moving member and varying a field between the permanent magnets and the poles and the rail facilitates keeping the gap 1218, 1220 between the rail and the moving member fixed. Here, varying the field imparted by the permanent magnet to the rail with a variable magnetic switch as a magnetic field adjuster (similar to a switched magnetic base) may offset static or dynamic loads that the electric actuators would otherwise have to support.

An example embodiment may be provided in an apparatus comprising a first device configured to support at least one substrate thereon; and a first transport having the device connected thereto, where the transport is configured to carry the device, where the transport comprises: a plurality of supports which are movable relative to one another along a linear path; at least one magnetic bearing which at least partially couples the supports to one another, where a first one of the magnetic bearings comprises a first permanent magnet and a second magnet, where the first permanent magnet is connected to a first one of the supports; and a magnetic field adjuster connected to the first support which is configured to move the first permanent magnet and/or vary influence of a magnetic field of the first permanent magnet relative to the second magnet.

The device may comprise at least one of an articulate robot, such as robots 150, 234, 236, 614 and 616 for example, and a substrate shuttle, such as 314, 314' and 314" for example. The supports may comprise at least one stationary guide rail. The second magnet may be connected to one of the first support and the second support. The second magnet may comprise an electromagnet or a permanent magnet. The supports may form a non-contacting thermal coupling having interleaved opposing surfaces configured to transfer heat to one another by radiation and convection as a function of pressure. The first support may comprise a first capacitive interface; where a second one of the supports comprises a second capacitive interface, and where the first and second capacitive interfaces are sized, shaped and located relative to each other to provide a non-contacting capacitive power coupling and to allow heat transfer between the first and second capacitive interfaces. The first support may comprise a heat radiator thereon, where the first magnetic bearing is a non-contacting bearing, and where the apparatus further comprises: a first power coupling between the first support and a second one of the supports, where the first power coupling is a non-contacting power coupling; and a first heat pump connected to the first support, where at least one of the first magnetic bearing and the first power coupling comprise at least one active heat generating component, and where the first heat pump is configured to pump heat from the at least one active heat generating component to the heat radiator. The apparatus may further comprise a non-contacting communications coupling between the supports. The apparatus may further comprise a second device configured to support at least one substrate thereon; and a second transport having the second device connected thereto, where the second transport is configured to carry the second device, where the second transport comprises: a plurality of second supports which are movable relative to one another along a linear path; and at least one second magnetic bearing which at least partially couples the second supports, where the transports are configured to move the devices with the devices at least partially passing over one another. A substrate transport apparatus may be provided comprising a chamber forming an enclosed environment; and the apparatus, where a second one of the supports is stationarily on a wall of the chamber.

An example embodiment may be provided in an apparatus comprising a device configured to support at least one substrate thereon; and a transport having the device connected thereto, where the transport is configured to carry the device, where the transport comprises: a first support comprising a first capacitive interface; and a second support comprising a second capacitive interface, where the second support is movably connected to the first support along a linear path, and where the first and second capacitive interfaces are sized, shaped and located relative to each other to provide a non-contacting capacitive power coupling and to allow heat transfer between the first and second capacitive interfaces.

The capacitive interfaces may comprise interleaved opposing surfaces configured to transfer heat to one another by radiation and convection as a function of pressure. The apparatus may comprise at least one magnetic bearing which at least partially couples the first and second supports to one another, where a first one of the magnetic bearings comprises a first permanent magnet and a second magnet, where the first permanent magnet is connected to the first support; and a magnetic field adjuster connected to the first support which is configured to move the first permanent magnet and/or vary influence of a magnetic field of the first permanent magnet relative to the second magnet. The second magnet may be connected to one of the first support and the second support. The second magnet may comprise an electromagnet or a permanent magnet. The device may comprise at least one of an articulate robot and a substrate shuttle. The supports may comprise at least one stationary guide rail. The first support may comprise a heat radiator thereon, where the first magnetic bearing is a non-contacting bearing, and where the apparatus further comprises: a first power coupling between the first support and the second support, where the first power coupling is a non-contacting power coupling; and a first heat pump connected to the first support, where at least one of the first magnetic bearing and the first power coupling comprise at least one active heat generating component, and where the first heat pump is configured to pump heat from the at least one active heat generating component to the heat radiator. The apparatus may further comprise a non-contacting communications coupling between the supports. The apparatus may further comprise a second device configured to support at least one substrate thereon; and a second transport having the second device connected thereto, where the second transport is configured to carry the second device, where the second transport comprises: a plurality of second supports which are movable relative to one another along a linear path; and at least one second magnetic bearing which at least partially couples the second supports, where the transports are configured to move the devices with the devices at least partially passing over one another. A substrate transport apparatus may be provided comprising: a chamber forming an enclosed environment; and the apparatus, where the second support is stationarily on a wall of the chamber.

An example embodiment may be provided in an apparatus comprising a device configured to support at least one substrate thereon; and a transport having the device connected thereto, where the transport is configured to carry the device, where the transport comprises: a plurality of supports which are movable relative to one another along a linear path, where a first one of the supports comprises a heat radiator thereon; a first magnetic bearing which at least partially couples the supports, where the first magnetic bearing is a non-contacting bearing; a first power coupling between the supports, where the first power coupling is a non-contacting power coupling; and a first heat pump connected to the first support, where at least one of the first magnetic bearing and the first power coupling comprise at least one active heat generating component, and where the first heat pump is configured to pump heat from the at least one active heat generating component to the heat radiator.

The first heat pump may comprise a vapor compression heat pump or thermoelectric heat pump.

An example method may comprise: coupling a first support to a second support comprising a magnetic bearing, where the first support is movable relative to the second support along a linear path without the first support contacting the second support, where the magnetic bearing comprises a permanent magnet on the first support; locating a magnetic field adjuster on the first support, where the magnetic field adjuster is configured to move the first permanent magnet and/or vary influence of a magnetic field of the first permanent magnet relative to a second magnet of the magnetic bearing; and connecting a first device to the first or second support, where the supports are configured to move the device, where the first device is configured to support at least one substrate thereon during movement of the first device.

Connecting a first device to the first or second support may comprise the first device being at least one of an articulate robot and a substrate shuttle which are mounted onto the first support. The second support may comprise a stationary guide rail, and where the first support is coupled to be longitudinally movable relative to the stationary guide rail. The method may further comprise connecting the second magnet to the first or second support, where the second magnet comprises a permanent magnet and/or an electromagnet. The method may further comprise providing a heat transfer system between the first and second supports which forms a non-contacting thermal coupling having respective interleaved opposing surfaces on the supports configured to transfer heat to one another by radiation and convection as a function of pressure. The method may further comprise the first support providing a first capacitive interface; the second support providing a second capacitive interface, and the first and second capacitive interfaces being located relative to each other to provide a non-contacting capacitive power coupling and to allow heat transfer between the first and second capacitive interfaces. The method may further comprise providing the first support with a heat radiator thereon, where the magnetic bearing is a non-contacting bearing, and where the method further comprises: providing a first power coupling between the first support and the second support, where the first power coupling is a non-contacting power coupling; and providing a first heat pump connected to the first support, where at least one of the magnetic bearing and the first power coupling comprise at least one active heat generating component, and where the first heat pump is configured to pump heat from the at least one active heat generating component to the heat radiator. The method may further comprise providing a non-contacting communications coupling between the supports. The method may further comprise locating the first and second supports in a chamber, where the chamber is configured to be enclosed to provide an enclosed environment within the chamber. The method may further comprise locating a second set of supports in the chamber, where the second set of supports comprise a magnetic bearing, and where the second set of supports are located relative to each other for relative movement along a linear path without contacting one another; and connecting a second device to the second set of supports, where the supports are configured to move the second device, where the second device is configured to support at least one substrate thereon during movement of the second device; where the supports are configured to move the devices in the chamber with the devices at least partially passing over one another. The method may further comprise using the magnetic field adjuster to adjust a gap between the first and second supports. Using the magnetic field adjuster to adjust a gap between the first and second supports may be done dynamically while the first support is moving relative to the second support along the linear path. The method may further comprise measuring a distance of the gap during movement of the first support relative to the second support, and a controller using the measured gap distance to control the magnetic field adjuster.

An example method may comprise: providing a transport comprising: a first support comprising a first capacitive interface; and a second support comprising a second capacitive interface, where the second support is movably connected to the first support along a linear path, and where the first and second capacitive interfaces are sized, shaped and located relative to each other to provide a non-contacting capacitive power coupling and to allow heat transfer between the first and second capacitive interfaces; and connecting a device to the transport, where the device is configured to support at least one substrate thereon while the device is moved by the transport, where the transport is configured to move the device to thereby move the at least one substrate. The capacitive interfaces may be interleaved with each other with opposing surfaces configured to transfer heat to one another by radiation and convection as a function of pressure. Providing the transport may comprise: providing at least one magnetic bearing which at least partially couples the first and second supports to one another, where a first one of the magnetic bearings comprises a first permanent magnet and a second magnet, where the first permanent magnet is connected to the first support; and providing a magnetic field adjuster connected to the first support which is configured to move the first permanent magnet and/or vary influence of a magnetic field of the first permanent magnet relative to the second magnet. The second magnet may comprise an electromagnet or a permanent magnet, where the second magnet is connected to one of the first support and the second support, and where the device comprises at least one of an articulate robot and a substrate shuttle. The method may further comprise providing a first heat pump connected to the first support, where at least one of a first magnetic bearing between the first and second supports and the power coupling comprise at least one active heat generating component, and where the first heat pump is configured to pump heat from the at least one active heat generating component to the heat radiator. The method may further comprise providing a non-contacting communications coupling between the supports. The method may further comprise providing a second transport comprising: a third support comprising a third capacitive interface; and a fourth support comprising a fourth capacitive interface, where the fourth support is movably connected to the third support along a linear path, and where the third and fourth capacitive interfaces are sized, shaped and located relative to each other to provide a non-contacting capacitive power coupling and to allow heat transfer between the third and fourth capacitive interfaces; and connecting a second device to the second transport, where the second device is configured to support at least one substrate thereon while the second device is moved by the second transport, where the second transport is configured to move the second device to thereby move the at least one substrate.

An example embodiment may be provided in a non-transitory program storage device (such as memory 167 shown in FIG. 1 for example) readable by a machine, tangibly embodying a program of instructions executable by the machine for performing operations, the operations comprising: determining a distance between a first support and a second support in a transporter, where a first device configured to support at least one substrate thereon is connected to the first support, where the supports are movable relative to one another along a linear path, where the first and second supports are coupled to each other by a magnetic bearing, where the magnetic bearing comprises a first permanent magnet and a second magnet, where the first permanent magnet is connected to the first support, where the transporter comprises a magnetic field adjuster connected to the first support which is configured to move the first permanent magnet and/or vary influence of a magnetic field of the first permanent magnet relative to the second magnet, where the transporter comprises a device connected thereto; and controlling the magnetic field adjuster to substantially maintain the distance between the first and second supports. The operations may further comprise controlling a heat pump, connected to the first support, to pump heat from the at least one active heat generating component on the first support to the heat radiator of the first support.

It should be seen that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
    a first device configured to support at least one substrate thereon, where the first device comprises at least one of an articulate robot and a substrate shuttle configured to move the substrate in a substrate processing apparatus or between substrate processing apparatus; and
    a first transport having the first device connected thereto, where the transport is configured to carry the first device, where the first transport comprises:
        a plurality of supports, where at least one of the supports is movable relative to one another one of the supports along a linear path;
        at least one magnetic bearing which at least partially couples the supports to one another, where a first one of the magnetic bearings comprises a first permanent magnet and a second magnet, where the first permanent magnet is connected to a first one of the supports; and
        a magnetic field adjuster connected to the first support which is configured to move the first permanent magnet and/or vary influence of a magnetic field of the first permanent magnet relative to the second magnet.

2. An apparatus as in claim 1 where the supports comprise at least one stationary guide rail.

3. An apparatus as in claim 1 where the second magnet is connected to one of the first support and the second support.

4. An apparatus as in claim 1 where the second magnet comprises an electromagnet or a permanent magnet.

5. An apparatus as in claim 1 where the first support comprises a first capacitive interface; where a second one of the supports comprises a second capacitive interface, and where the first and second capacitive interfaces are sized, shaped and located relative to each other to provide a non-contacting capacitive power coupling and to allow heat transfer between the first and second capacitive interfaces.

6. An apparatus as in claim 1 where the first support comprises a heat radiator thereon, where the first magnetic bearing is a non-contacting bearing, and where the apparatus further comprises:
- a first power coupling between the first support and a second one of the supports, where the first power coupling is a non-contacting power coupling; and
- a first heat pump connected to the first support, where at least one of the first magnetic bearing and the first power coupling comprise at least one active heat generating component, and where the first heat pump is configured to pump heat from the at least one active heat generating component to the heat radiator.

7. An apparatus as in claim 1 further comprising a non-contacting communications coupling between the supports.

8. An apparatus comprising:
- a first device configured to support at least one substrate thereon; and
- a first transport having the first device connected thereto, where the transport is configured to carry the first device, where the first transport comprises:
  - a plurality of supports, where at least one of the supports is movable relative to one another one of the supports along a linear path;
  - at least one magnetic bearing which at least partially couples the supports to one another, where a first one of the magnetic bearings comprises a first permanent magnet and a second magnet, where the first permanent magnet is connected to a first one of the supports; and
  - a magnetic field adjuster connected to the first support which is configured to move the first permanent magnet and/or vary influence of a magnetic field of the first permanent magnet relative to the second magnet,
- where the supports form a non-contacting thermal coupling having interleaved opposing surfaces configured to transfer heat to one another by radiation and convection as a function of pressure.

9. An apparatus comprising:
- a first device configured to support at least one substrate thereon; and
- a first transport having the first device connected thereto, where the transport is configured to carry the first device, where the first transport comprises:
  - a plurality of supports, where at least one of the supports is movable relative to one another one of the supports along a linear path;
  - at least one magnetic bearing which at least partially couples the supports to one another, where a first one of the magnetic bearings comprises a first permanent magnet and a second magnet, where the first permanent magnet is connected to a first one of the supports; and
  - a magnetic field adjuster connected to the first support which is configured to move the first permanent magnet and/or vary influence of a magnetic field of the first permanent magnet relative to the second magnet,
- a second device configured to support at least one substrate thereon; and
- a second transport having the second device connected thereto, where the second transport is configured to carry the second device, where the second transport comprises:
  - a plurality of second supports which are movable relative to one another along a linear path; and
  - at least one second magnetic bearing which at least partially couples the second supports,
- where the transports are configured to move the devices with the devices at least partially passing over one another.

10. A substrate transport apparatus comprising:
- a chamber forming an enclosed environment; and
- an apparatus comprising:
  - a first device configured to support at least one substrate thereon, where the first device comprises at least one of an articulate robot and a substrate shuttle; and
  - a first transport having the first device connected thereto, where the transport is configured to carry the first device, where the first transport comprises:
    - a plurality of supports, where at least one of the supports is movable relative to one another one of the supports along a linear path;
    - at least one magnetic bearing which at least partially couples the supports to one another, where a first one of the magnetic bearings comprises a first permanent magnet and a second magnet, where the first permanent magnet is connected to a first one of the supports; and
    - a magnetic field adjuster connected to the first support which is configured to move the first permanent magnet and/or vary influence of a magnetic field of the first permanent magnet relative to the second magnet,
  - where a second one of the supports is stationarily on a wall of the chamber.

11. An apparatus comprising: a device configured to support at least one substrate thereon; and a transport having the device connected thereto, where the transport is configured to carry the device, where the transport comprises: a first support comprising a first capacitive interface; and a second support comprising a second capacitive interface, where the second support is movably connected relative to the first support along a linear path, and where the first and second capacitive interfaces are sized, shaped and located relative to each other to provide a non-contacting capacitive power coupling and to allow heat transfer between the first and second capacitive interfaces; and
- a second device configured to support at least one substrate thereon; and a second transport having the second device connected thereto, where the second transport is configured to carry the second device, where the second transport comprises: a plurality of second supports which are movable relative to one another along a linear path; and at least one second magnetic bearing which at least partially couples the second supports, where the transports are configured to move the devices with the devices at least partially passing over one another.

12. An apparatus as in claim 11 where the capacitive interfaces comprise interleaved opposing surfaces configured to transfer heat to one another by radiation and convection as a function of pressure.

13. An apparatus as in claim 11 where the apparatus comprises:
- at least one magnetic bearing which at least partially couples the first and second supports to one another, where a first one of the magnetic bearings comprises a first permanent magnet and a second magnet, where the first permanent magnet is connected to the first support; and a magnetic field adjuster connected to the first support which is configured to move the first permanent magnet and/or vary influence of a magnetic field of the first permanent magnet relative to the second magnet.

14. An apparatus as in claim 13 where the second magnet is connected to one of the first support and the second support.

15. An apparatus as in claim 13 where the second magnet comprises an electromagnet or a permanent magnet.

16. An apparatus as in claim 11 where the device comprises at least one of an articulate robot and a substrate shuttle.

17. An apparatus as in claim 11 where the supports comprise at least one stationary guide rail.

18. An apparatus as in claim 11 where the first support comprises a heat radiator thereon, where the first magnetic bearing is a non-contacting bearing, and where the apparatus further comprises:
   a first power coupling between the first support and the second support, where the first power coupling is a non-contacting power coupling; and
   a first heat pump connected to the first support, where at least one of the first magnetic bearing and the first power coupling comprise at least one active heat generating component, and where the first heat pump is configured to pump heat from the at least one active heat generating component to the heat radiator.

19. An apparatus as in claim 11 further comprising a non-contacting communications coupling between the supports.

20. A substrate transport apparatus comprising:
a chamber forming an enclosed environment; and
the apparatus as in claim 11, where the second support is stationarily on a wall of the chamber.

21. An apparatus comprising:
a device configured to support at least one substrate thereon; and
a transport having the device connected thereto, where the transport is configured to carry the device, where the transport comprises:
   a plurality of supports which are movable relative to one another along a linear path, where a first one of the supports comprises a heat radiator thereon;
   a first magnetic bearing which at least partially couples the supports, where the first magnetic bearing is a non-contacting bearing;
   a first power coupling between the supports, where the first power coupling is a non-contacting power coupling; and
   a first heat pump connected to the first support, where at least one of the first magnetic bearing and the first power coupling comprise at least one active heat generating component, and where the first heat pump is configured to pump heat from the at least one active heat generating component to the heat radiator.

22. An apparatus as in claim 21 where the first heat pump comprises a vapor compression heat pump or thermoelectric heat pump.

* * * * *